United States Patent
Takasugi et al.

(10) Patent No.: US 7,937,633 B2
(45) Date of Patent: May 3, 2011

(54) SEMICONDUCTOR DEVICE USING LOGIC CHIP

(75) Inventors: Kouji Takasugi, Kanagawa (JP);
Noriaki Komatsu, Kanagawa (JP);
Nobutoshi Tsunesada, Kanagawa (JP);
Kazunori Yamane, Kanagawa (JP)

(73) Assignee: Reneas Electronics Corporation, Kanagawa (JP)

( * ) Notice: Subject to any disclaimer, the term of this patent is extended or adjusted under 35 U.S.C. 154(b) by 304 days.

(21) Appl. No.: 12/190,196

(22) Filed: Aug. 12, 2008

(65) Prior Publication Data
US 2009/0049349 A1    Feb. 19, 2009

(30) Foreign Application Priority Data
Aug. 14, 2007    (JP) .................................. 2007-211235

(51) Int. Cl.
*G11C 29/00* (2006.01)
(52) U.S. Cl. ....................................................... 714/718
(58) Field of Classification Search .................. 714/718, 714/733
See application file for complete search history.

(56) References Cited

U.S. PATENT DOCUMENTS

| | | | | |
|---|---|---|---|---|
| 5,303,246 | A * | 4/1994 | Anderson et al. | 714/727 |
| 6,550,023 | B1 * | 4/2003 | Brauch et al. | 714/42 |
| 6,586,921 | B1 * | 7/2003 | Sunter | 324/76.11 |
| 7,310,748 | B2 * | 12/2007 | Jeddeloh | 714/42 |
| 7,321,980 | B2 * | 1/2008 | Das et al. | 713/601 |
| 7,665,003 | B2 * | 2/2010 | Shen et al. | 714/733 |

FOREIGN PATENT DOCUMENTS
JP    2004158098 A    6/2004
* cited by examiner

*Primary Examiner* — Robert Beausoliel
*Assistant Examiner* — Steve Nguyen
(74) *Attorney, Agent, or Firm* — Sughrue Mion, PLLC

(57) ABSTRACT

A system-in-package type semiconductor device includes a logic chip; and a memory chip connected with external terminal through the logic chip. The logic chip includes a data holding circuit configured to hold a test data in a test mode, and store the test data supplied through the data input/output terminal in the data holding circuit in response to a test data set command, and writes the test data which has been stored in the data holding circuit in the memory chip in response to the test data write command.

8 Claims, 12 Drawing Sheets

US 7,937,633 B2

SEMICONDUCTOR DEVICE USING LOGIC CHIP

INCORPORATION BY REFERENCE

This application claims a priority on convention based on Japanese Patent Application No. 2007-211235 filed on Aug. 14, 2007. The disclosure thereof is incorporated herein by reference.

BACKGROUND OF THE INVENTION

1. Field of the Invention

The present invention relates to a semiconductor device such as a semiconductor device of a system-in-package type.

2. Description of Related Art

Multiple functions and high performance in a semiconductor device are requested in accompaniment with a progress of an information processing technique. As a technique to fulfill such a request, a semiconductor device of a system-in-package ("SiP") type is known, in which a plurality of LSIs are sealed in a single package. In the semiconductor device of the system-in-package type, miniaturization of package size and reduction of the number of pins are requested. In view of these, the system-in-package type semiconductor device have prevailed, in which a logic chip and a memory chip are mounted without including any external terminal for outputting data directly from the memory chip (hereinafter to be referred to as an external memory terminal).

In a package having no external memory terminal, it may be difficult to perform a memory test after a system is assembled in the package. In the package having no external memory terminal, a technique has been known for performing a test on a memory chip through an external terminal for inputting/outputting data to/from the logic chip in the package and a logic chip test circuit, as shown in Japanese Patent Application Publication (JP-P2004-158098A).

FIG. 1 is a circuit diagram showing a configuration of a conventional system-in-package type semiconductor device 101. The semiconductor device 101 includes a logic chip 102 and a memory chip 103. The semiconductor device 101 further includes a bus control terminal 105, a data input/output terminal 106, a clock supply terminal 107 and an address/control signal supply terminal 108. The terminals are connectable to a tester 104. The semiconductor device 101 has no terminal dedicated to the memory chip 103 as an external terminal. Thus, when the test is performed on the memory chip 103, the logic chip 102 is set to a test mode so that a data and signals are transferred through a test circuit to the memory chip 103 and an access is made through a logic terminal to the memory chip 103.

A bus release control signal I/O_en is supplied through the bus control terminal 105 to control bus release of a test circuit in a memory chip data write. A register setting data DATA is supplied through the data input/output terminal 106. In addition, a result of a memory chip data read is outputted through the data input/output terminal 106. A clock signal CLK is supplied through the clock supply terminal 107, to control the memory chip 103. An address signal Add and a control signal Ctrl are supplied through the address/control signal supply terminal 108. The address signal Add specifies an address of the memory chip 103 whereas the control signal Ctrl is used for controlling the memory chip 103.

As shown in FIG. 1, the logic chip test circuit is provided with a first flip-flop 111 to a fourth flip-flop 114, to allow a high-speed operation. The flip-flops 111 to 114 are formed on signal lines for a high frequency, to reduce a variation in signal propagation.

A data signal supplied to the data input/output terminal 106 is transferred to the memory chip 103 through the flip-flops. Therefore, the data signal is supplied to the memory chip 103 with a delay of several clock pulses. FIG. 2 is a timing chart showing an operation of the system-in-package type semiconductor device 101 provided with 2-stage flip-flops, in which the first flip-flop 111 and the second flip-flop 112 are disposed in series whereas the third flip-flop 113 and the fourth flip-flop 114 are disposed in series. Referring to FIG. 2, the data signal supplied through the data input/output terminal 106 is supplied to the memory chip 103 with a delay of 2 clock pulses in case of the data write into the memory chip 103. In contrast, in case of the data read from the memory chip 103, the data signal is outputted from the memory chip 103 through the data input/output terminal 106 with a delay of 2 clock pulses. That is, when the data signal is write into and read from the memory chip 103, a delay of 4 clock pulses is caused in total.

FIG. 3 is a timing chart showing an operation of the system-in-package type semiconductor device 101 when the data read and the data write are continuously performed to the memory chip 103. Usually, a continuous operation to the memory chip 103 cannot be performed unless the data write is performed immediately after the data read. Thus, in case of the operation shown in FIG. 3, it is assumed that a read command RED is supplied in 4 clock pulses after a first write command WRT, and then a write command WRT is supplied again in 5 clock pulses after the read command. In this case, the data input/output terminal 106 are simultaneously used for data input and data output at the supply of a second write command. That is to say, the simultaneous operation of the data read and the data write cannot be operated. Thus, in the conventional circuit configuration using the flip-flops, it is impossible to perform the operation test in which the data read and the data write are continuously performed.

In other words, in the conventional system-in-package type semiconductor device 101, when the memory chip 103 is tested in a high-speed operation through the logic chip test circuit, a test data signal is synchronized with the clock signal in the logic chip 102. Therefore, a clock delay is caused due to the flip-flops when the data signal is supplied to the memory chip 103 or outputted from the memory chip 103. Therefore, it is difficult to test a continuous operation of the data read and the data write subsequent to the data read to the memory chip due to the clock delay.

SUMMARY

In a first aspect of the present invention, a system-in-package type semiconductor device includes: a logic chip; and a memory chip connected with external terminal through the logic chip. The logic chip includes a data holding circuit configured to hold a test data in a test mode, and store the test data supplied through the data input/output terminal in the data holding circuit in response to a test data set command, and writes the test data which has been stored in the data holding circuit in the memory chip in response to the test data write command.

In a second aspect of the present invention, a logic chip includes: a data holding circuit configured to hold a test data in a test mode; a data setting circuit configured to supply the test data to the data holding circuit; a data write circuit configured to supply the test data stored in the data holding circuit to a memory chip. The data setting circuit stores the test data supplied through a data input/output terminal in the data holding circuit in response to a test data set command, and the data write circuit writes the test data stored in the data holding circuit in the memory chip in response to a test data write command.

According to the present invention, no data need to be inputted from a logic terminal at the time of data write by holding a data pattern for a memory chip test in a data register. The data is actually set in the data register by inputting the data by the use of a logic input/output terminal. The logic input/output terminal after the data is set in the register is used as a data output. As a consequence, a sequential operation of data read and data write in a memory chip can be tested in a semiconductor integrated circuit according to the present invention.

Moreover, a configuration of registers in the number of test patterns can cope with a plurality of test patterns. Additionally, data is serially inputted from a single data pin; whereas data read from a memory is compared with an expectation value at an output, and then, the comparison result is outputted to the data pin.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Hereinafter, a semiconductor device of the present invention will be described in detail by using a system-in-package type semiconductor device as an example, with reference to the attached drawings.

First Embodiment

Figure 1:
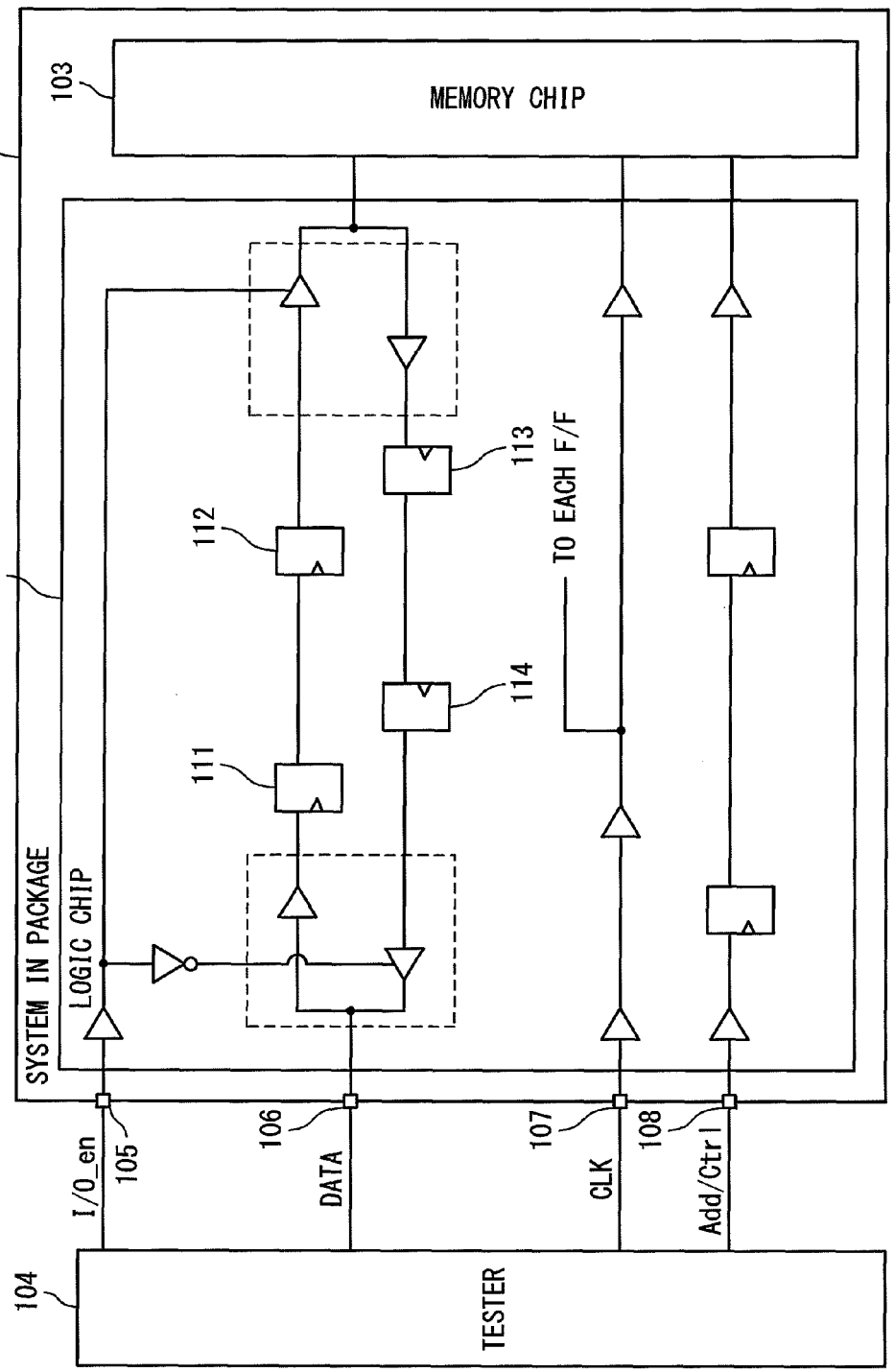
FIG. 1 is a circuit diagram showing a configuration of a conventional system-in-package type semiconductor device.
Figure 2:
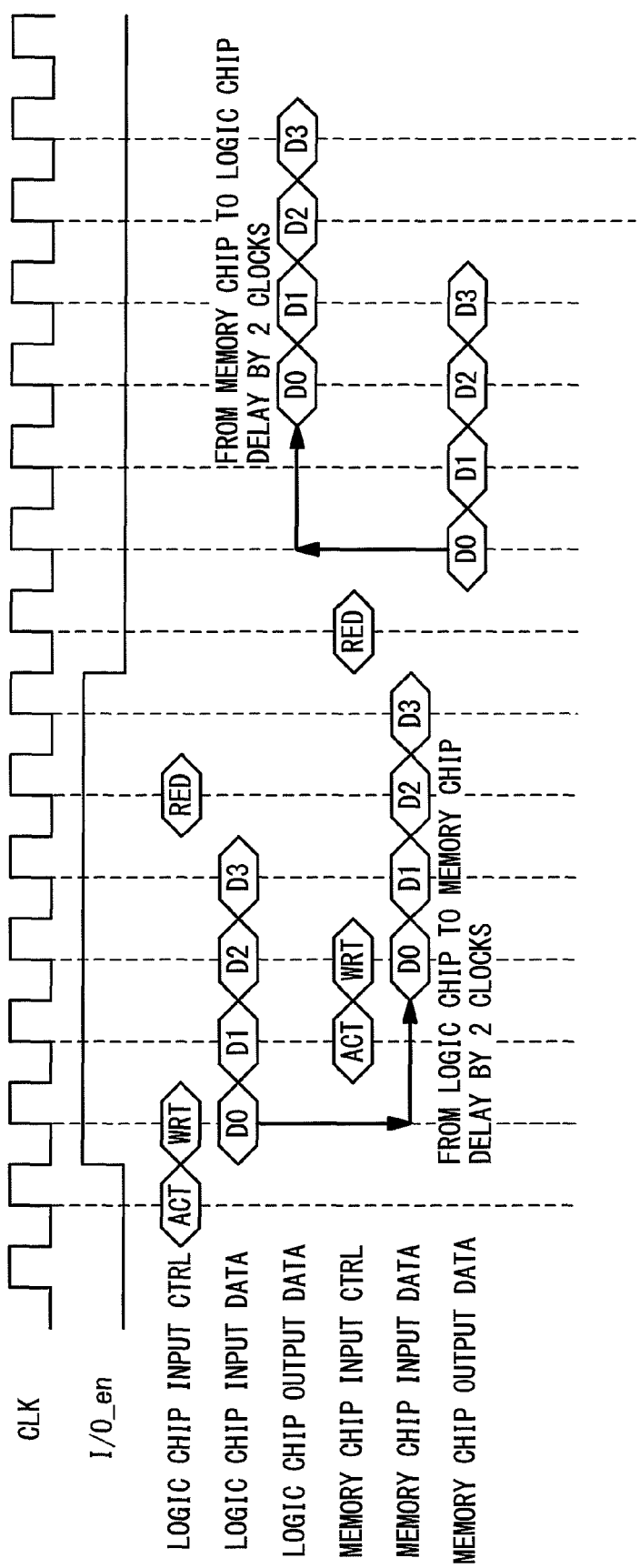
FIG. 2 is a timing chart showing an operation of the conventional system-in-package type semiconductor device when a first data write and a first data read are continuously performed to a memory chip.
Figure 3:
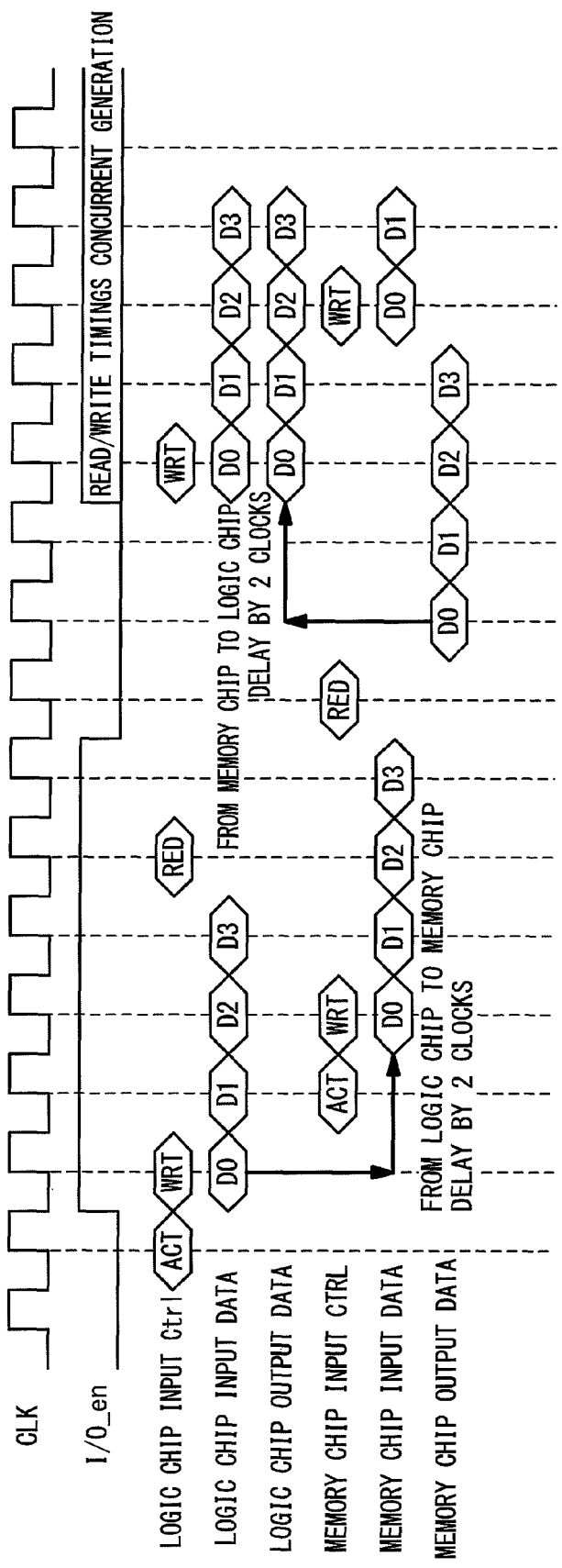
FIG. 3 is a timing chart showing an operation of the conventional system-in-package type semiconductor device when the first data write, the first data read and a second data write are continuously performed to the memory chip.
Figure 4:
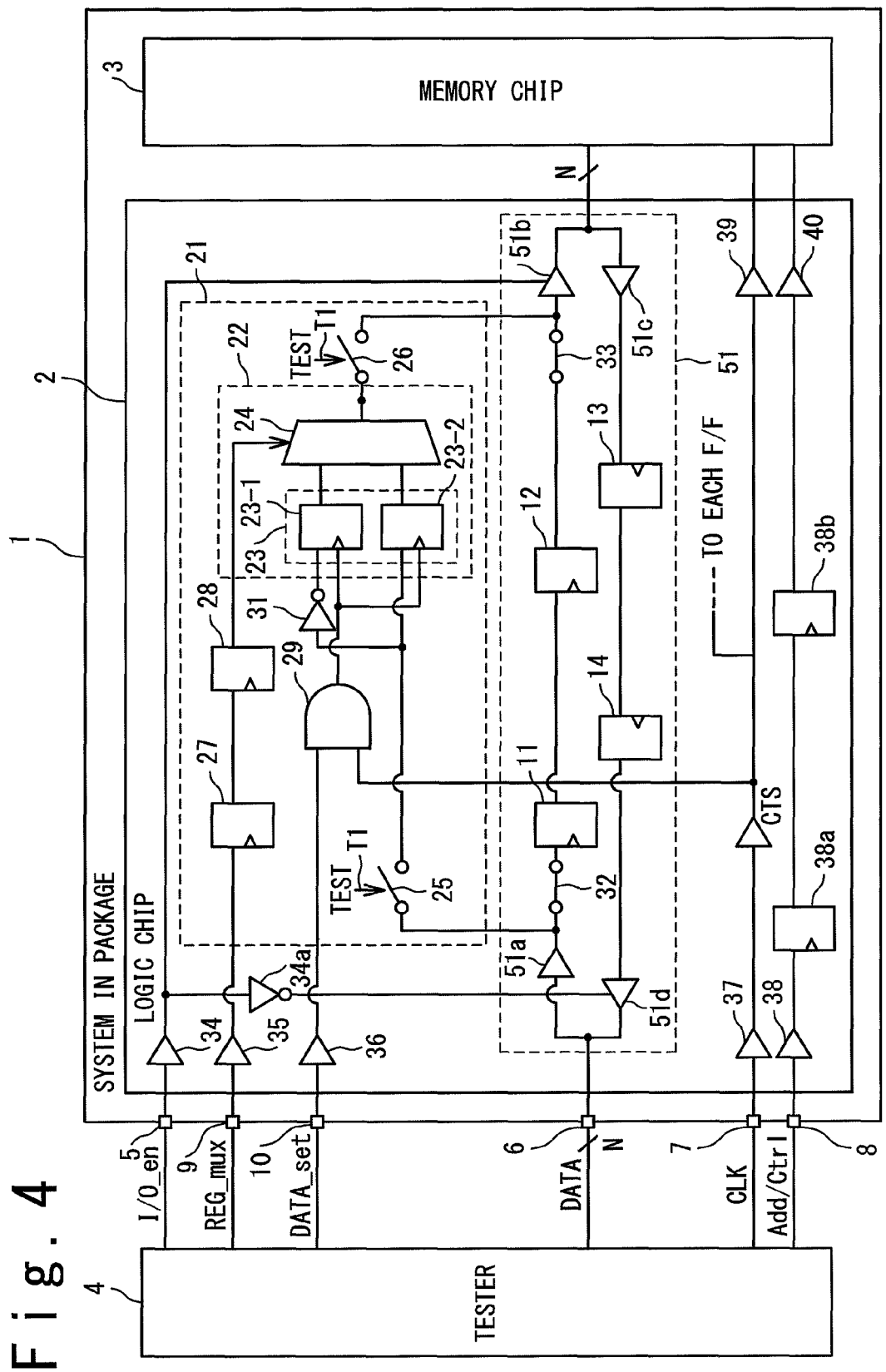
FIG. 4 is a circuit diagram showing a configuration of a system-in-package type semiconductor device according to a first embodiment of the present invention.

FIG. 4 is a circuit diagram showing the configuration of a system-in-package type semiconductor device 1 according to a first embodiment of the present invention. Referring to FIG. 4, the system-in-package type semiconductor device 1 includes a logic chip 2 and a memory chip 3. As seen from FIG. 4, the semiconductor device 1 in the first embodiment has no external terminal dedicated to the memory chip 3. As a consequence, when a test is performed on the memory chip 3, the logic chip 2 is set to a test mode, and an access to the memory chip 3 is performed through terminals for connecting the logic chip 2 to an exterior functional block.

The semiconductor device 1 includes a bus control terminal 5, a data input/output terminal 6, a clock supply terminal 7, an address/control signal supply terminal 8, a data/pattern selection signal supply terminal 9 and a register set supply terminal 10. These terminals are configured to be freely connectable to a tester 4. The tester 4 is provided with a function of outputting a bus release control signal I/O_en, a register setting data DATA, a clock signal CLK, an address signal Add, a control signal Ctrl, a data/pattern selection signal REG_mux and a register set control signal DATA_set. Here, although the register set supply terminal 10 is one in FIG. 4, the semiconductor device 1 in the first embodiment may have a plurality of register set supply terminals 10. For example, there may be provided register set supply terminals 10 for a number corresponding to the bit width of a memory chip data bus.

As shown in FIG. 4, the terminals 5, 9 and 10 are connected to buffers 34, 35 and 36, respectively. The terminal 6 is connected to a data input/output circuit 51. The terminals 7 and 8 are connected buffers 37 and 38 respectively. The output of the buffer 34 is connected the circuit 51 directly and through an inverter 34a. The outputs of the buffers 35 and 36 are connected to an activated circuit 21 activated in a test mode, and the activated circuit 21 is connected to the data input/output circuit 51. The data input/output circuit 51 is connected to the memory chip 3 The output of the buffer 37 is connected to a buffer CTS and the output of the buffer CTS is connected to the activated circuit 21, flip-flops (F/F) and the memory chip 3 through a buffer 39. The output of the buffer 38 is connected to the memory chip 3 through series connected flip-flops 38a and 38b and a buffer 40.

As shown in FIG. 4, the bus release control signal I/O_en is supplied through the bus control terminal 5 to the logic chip 2. The register setting data DATA is supplied through the data input/output terminal 6 to the logic chip 2. The clock signal CLK is supplied through the clock supply terminal 7 to the logic chip 2. The address signal Add or the control signal Ctrl is supplied through the address/control signal supply terminal 8 to the logic chip 2. The data/pattern selection signal REG_mux is supplied through the data/pattern selection signal supply terminal 9 to the logic chip 2. The register set control signal DATA_set is supplied to the register set supply terminal 10 supplies to the logic chip 2.

The activated circuit 51 includes a series-connected circuit as a data input route of a buffer 51a, a switch 32, a flip-flop 11, a flip-flop 12, a switch 33 and a controlled buffer 51b to transfer a data signal from the terminal 6 to the memory chip 3, and another series-connected circuit as a data output route of a buffer 51c, flip-flop 13, a flip-flop 14, and a controlled buffer 51d to transfer a data signal from the memory chip 3 to the terminal 6. The output of the buffer 34 is supplied to the buffer 51b directly and the buffer 51d through the inverter 34a. In other words, each of high-frequency signal lines in the data input/output circuit 51 is formed from 2-stage flip-flops. The switch 32 and the switch 33 are switched in response to a test signal T1.

The activated circuit 21 includes a series connected flip-flops 27 and 28 as registers, an AND circuit 29, switches 25 and 26, an inverter 31, and a test data holding circuit 22. The test data holding circuit 22 includes a register group 23 of flip-flops 23-1 and 23-2, and a selector 24. Test data patterns held in the flip-flops 23-1 and 23-2 of the register group 23 are used as a write data to the memory chip 3 and an expectation value for data read. It is preferable to provide the register group 23 of the registers for a number corresponding to the bus width of the memory chip 3 or for a number obtained by multiplying the bus width by m (m is an arbitrary natural number). Here, as the number "m" is increased, the number of test data patterns also is increased by the same number as m. It is assumed below that the register group 23 is provided with the register 23-1 and the register 23-2 for the sake of easy understanding of the present invention, and the bus width is "8."

The input of the flip-flop 27 is connected to the output of the buffer 35, and the output of the flip-flop 28 is connected to a selection control terminal of a selector 24. One input of the AND circuit 29 is connected to the output of the buffer 36 and the other input thereof is connected to the output of the buffer CTS. The output of the AND circuit 29 is connected to clock terminals of the flip-flops 23-1 and 23-2. The output of the buffer 51a is connected to a data terminal of the flip-flop 23-2 through the switch 25 and to a data terminal of the flip-flop 23-1 through the switch 25 and the inverter 31. The selector 24 selects one of the output of the flip-flop 23-1 and the output of the flip-flop 23-2 in response to the output of the flip-flop 28. The output of the selector 24 is connected to an input of the buffer 51b through the switch 26. As a consequence, the activated circuit 21 in the test mode performs a test operation when the first switch 25 and the second switch 26 are closed in response to the test signal T1.

This configuration does not limit targets to which the bus release control signal I/O_en is supplied, in the present embodiment. For example, the bus release control signal I/O_en may be supplied to each of four buffers in the data input/output circuit 51 shown in FIG. 4. The bus release control signal I/O_en is used to control the bus release in data write to the memory chip 3. The register setting data DATA is a test data to be supplied to a register group 23. The clock signal CLK is supplied to the logic chip 2 and the memory chip 3. The address signal Add is used for specifying an address of the memory chip 3. The control signal Ctrl is used to control the memory chip 3. Moreover, in the first embodiment, the data/pattern selection signal REG_mux is used to select a data pattern of the test data to be supplied to the memory chip 3. The register set control signal DATA_set is used to control the bus release of a logic data output.

Hereinafter, an operation of the system-in-package type semiconductor device 1 in the first embodiment will be described below. The semiconductor device 1 in the first embodiment performs a register data setting operation, a test data write operation and a test data read operation. In the register data setting operation, a test data is set in the register group 23. In the test data write operation, the test data is written in the memory chip 3 after the register data setting operation. In the test data read operation, the test data written in the memory chip 3 is read after the register data setting operation.

Figure 5:
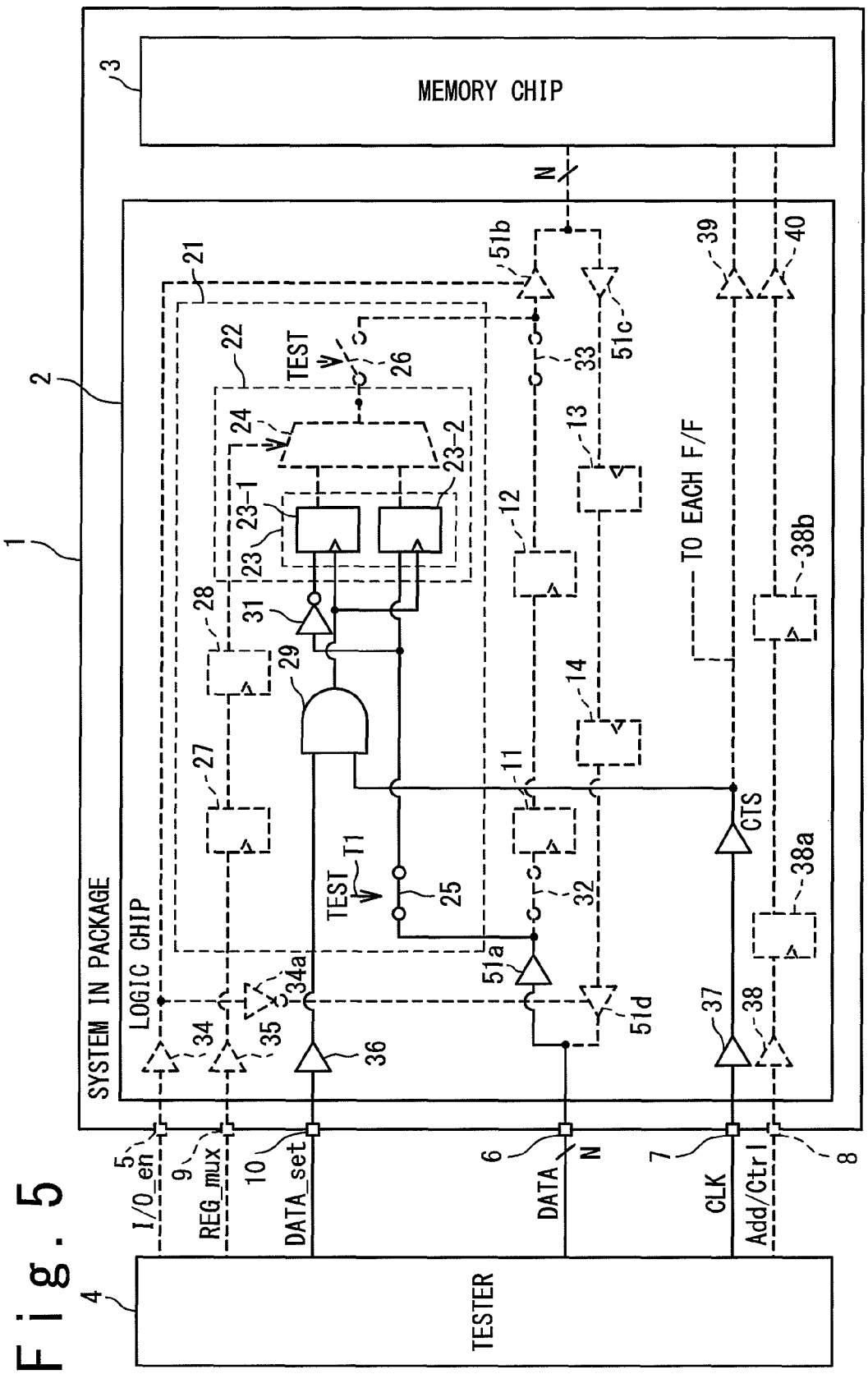
FIG. 5 is a circuit diagram showing a data route in a register data setting operation of the system-in-package type semiconductor device in the first embodiment.
Figure 6:
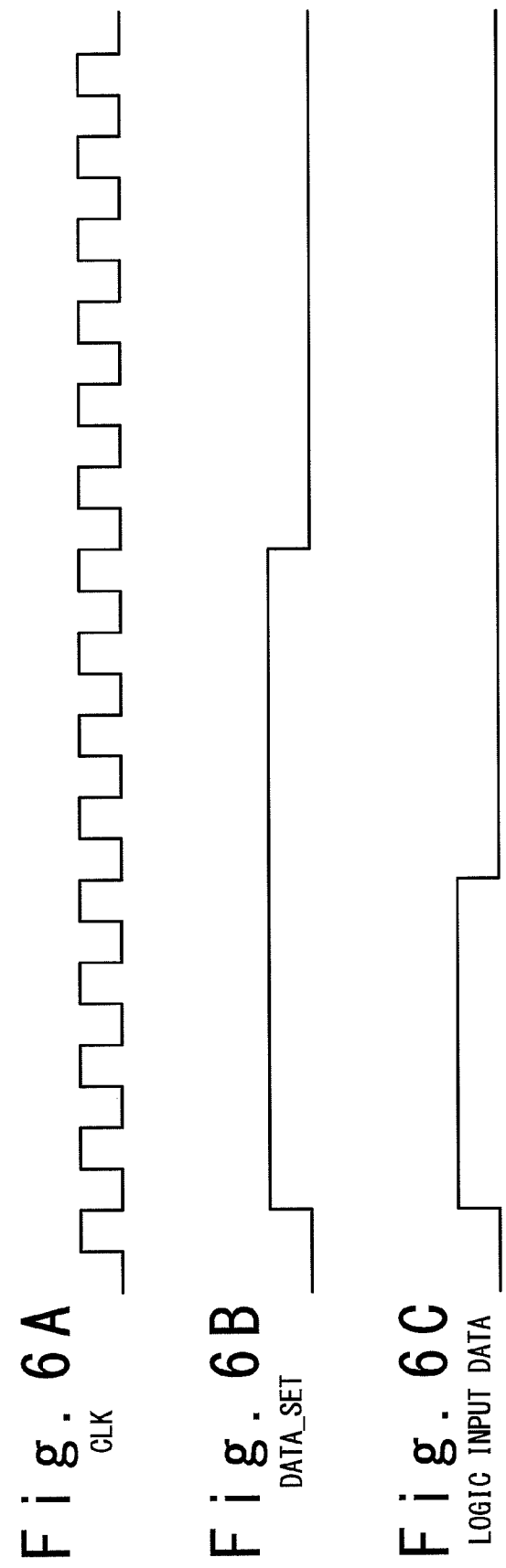
FIGS. 6A to 6C are timing charts showing the register data setting operation of the a system-in-package type semiconductor device in the first embodiment.

FIG. 5 is a circuit diagram showing the data input route during the register data setting operation. As shown in FIG. 5, the system-in-package type semiconductor device 1 performs the register data setting operation in response to a register set control signal DATA_set, the register setting data DATA and the clock signal CLK. FIGS. 6A to 6C are timing charts showing an operation for setting data "F0 (a hexadecimal number)" of the bus width 8 in the register group 23. As shown in FIGS. 6A to 6C, the same number of data as the bus width (or the bus width multiplied by the m patterns) is supplied from the register set supply terminal 10.

The AND circuit 29 operates in response to the register set control signal DATA_set supplied through the data/pattern selection signal supply terminal 10 and the clock signal CLK supplied through the clock supply terminal 7. The AND circuit 29 is activated in response to the register set control signal DATA_set, to output a resultant signal in synchronism with the clock signal CLK. The resultant signal is supplied to the register group 23 (i.e., the first register 23-1 and the second register 23-2). Therefore, the register setting data DATA are sequentially set to the first register 23-1 and the second register 23-2.

Figure 7:
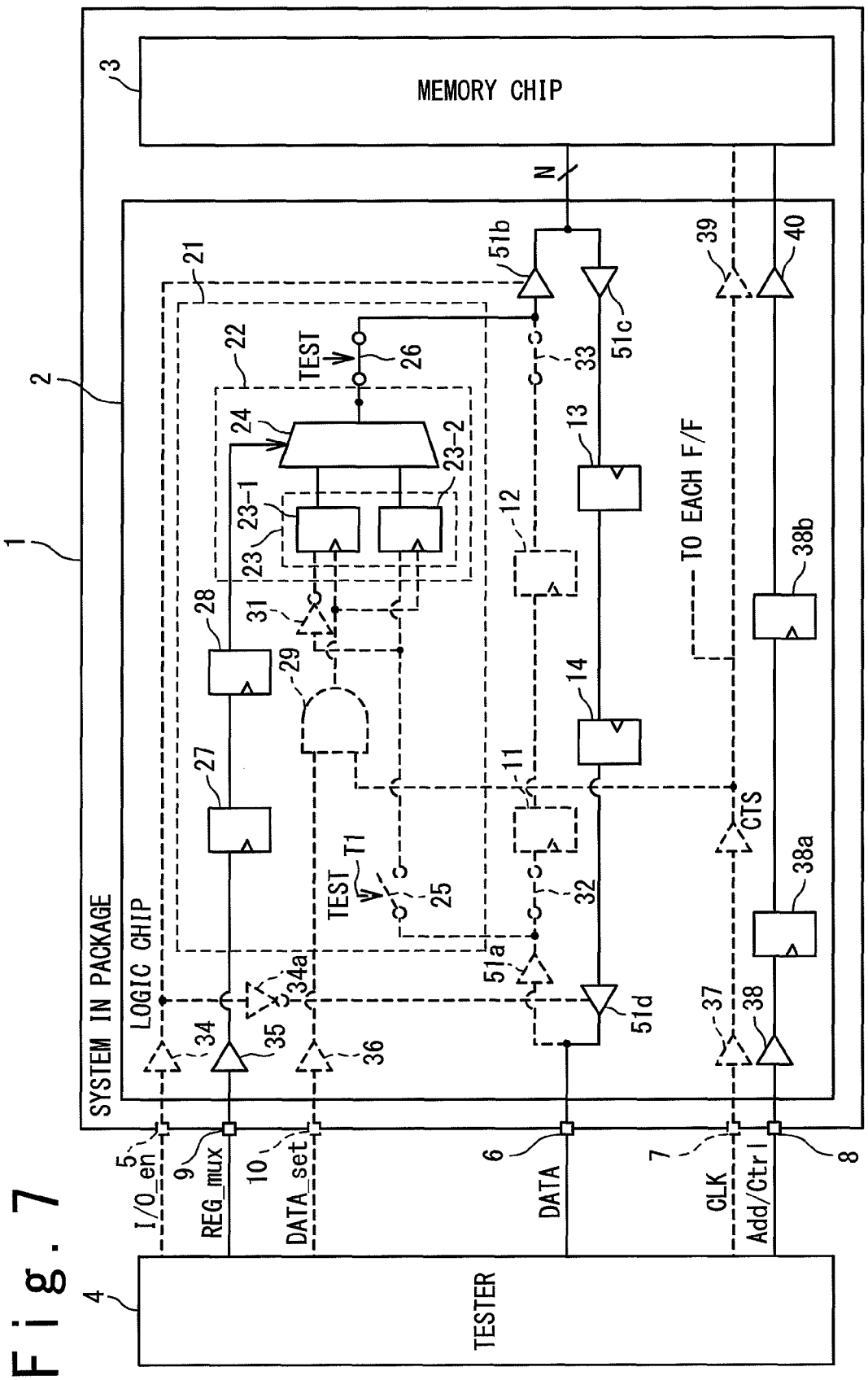
FIG. 7 is a circuit diagram showing a data route in a test data write operation and a test data read operation of the a system-in-package type semiconductor device in the first embodiment.

The activated circuit 21 of the logic chip 2 in the test mode performs the register data setting operation, and then performs the test data write operation. FIG. 7 is a circuit diagram showing the data input route during the test data write operation and a test data read operation. The logic chip 2 performs the test data write operation in response to a test data writing command supplied through the address/control signal supply terminal 8. Also, the logic chip 2 performs the test data read operation in response to a test data read command supplied through the address/control signal supply terminal 8.

Figure 8:
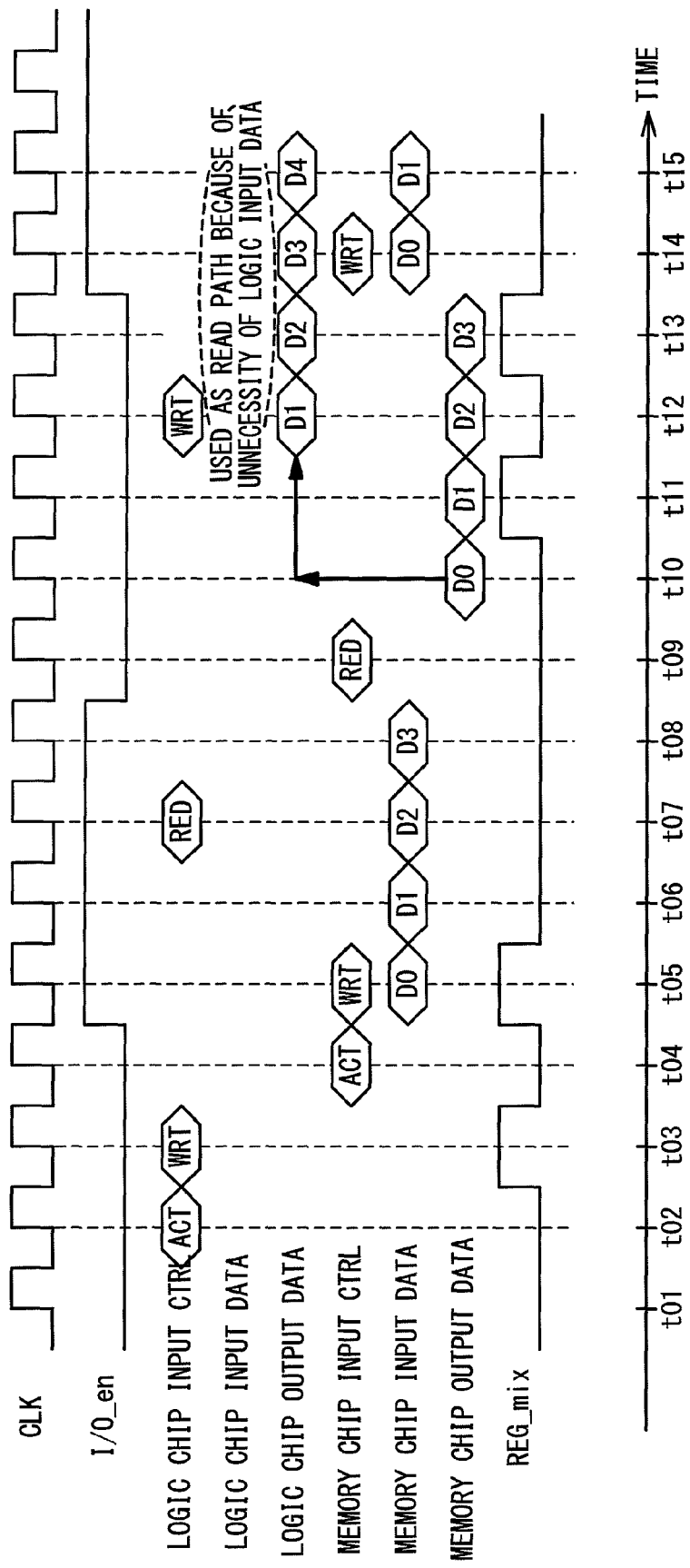
FIG. 8 is a timing chart showing the data write operation and the data read operation of the a system-in-package type semiconductor device in the first embodiment.

FIG. 8 is timing charts showing the data write operation and the data read operation. The logic chip 2 receives a test data write command through the address/control signal supply terminal 8 at time t02. Meanwhile, the logic chip 2 receives a test data write command into the memory chip 3 from the tester 4 with a delay of 2 clock pulses (i.e., at time t04).

At time t04, the write data to be written in the memory chip 3 is prepared in the register group 23. As a consequence, the second switch 26 is closed in response to the test signal T1, to form a data write route. The data write route from the logic chip 2 to the memory chip 3 should be preferably maintained until a completion of the data write operation. In case that the test data of a plurality of patterns are held in the register group 23, the data patterns are selected based on the data pattern selection signal REG_mux. Thus, the test data of the data pattern selected can be written in the memory chip 3.

At time t07, the logic chip 2 receives a test data read command supplied through the address/control signal supply terminal 8. The test data read command is supplied to the memory chip 3 with a delay of 2 clock pulses (i.e., at a timing t09). As shown in FIG. 8, the data read from the memory chip 3 is supplied to the data input/output terminal 6 with a delay of 2 clock pulses after it is read from the memory chip 3. The activated circuit 21 of the logic chip 2 in the test mode holds the test data of data patterns used for testing the memory chip 3 in the register group 23. Consequently, no data need to be supplied through the data input/output terminal 6 during the data write operation. Therefore, the system-in-package type semiconductor device 1 can use the data input/output terminal 6 after the register data setting operation as a terminal dedicated to data output. In this manner, even if the logic chip 2 receives the test data write command through the address/control signal supply terminal 8, for example, at time t11, the data read operation and the data write operation can be sequentially performed to the memory chip 3.

As described above, in the system-in-package type semiconductor device 1 in the first embodiment, the delay of 4 clock pulses in total is caused in the data read from the memory chip 3 since the delay of 2 clock pulses is required for write into the memory chip 3 and the delay of 2 clock pulses is required for read from the memory chip 3. The test data of data patterns for the memory chip 3 is set in the register group 23. When the data read operation and the data write operation for the memory chip 3 are sequentially performed, no write data need to be supplied to the memory chip 3 from the logic terminal. Thus, in the system-in-package type semiconductor device 1 in the first embodiment, the data read operation and the data write operation for the memory chip 3 can be sequentially performed even with a circuit configuration using a plurality of flip-flops.

Second Embodiment

Figure 9:
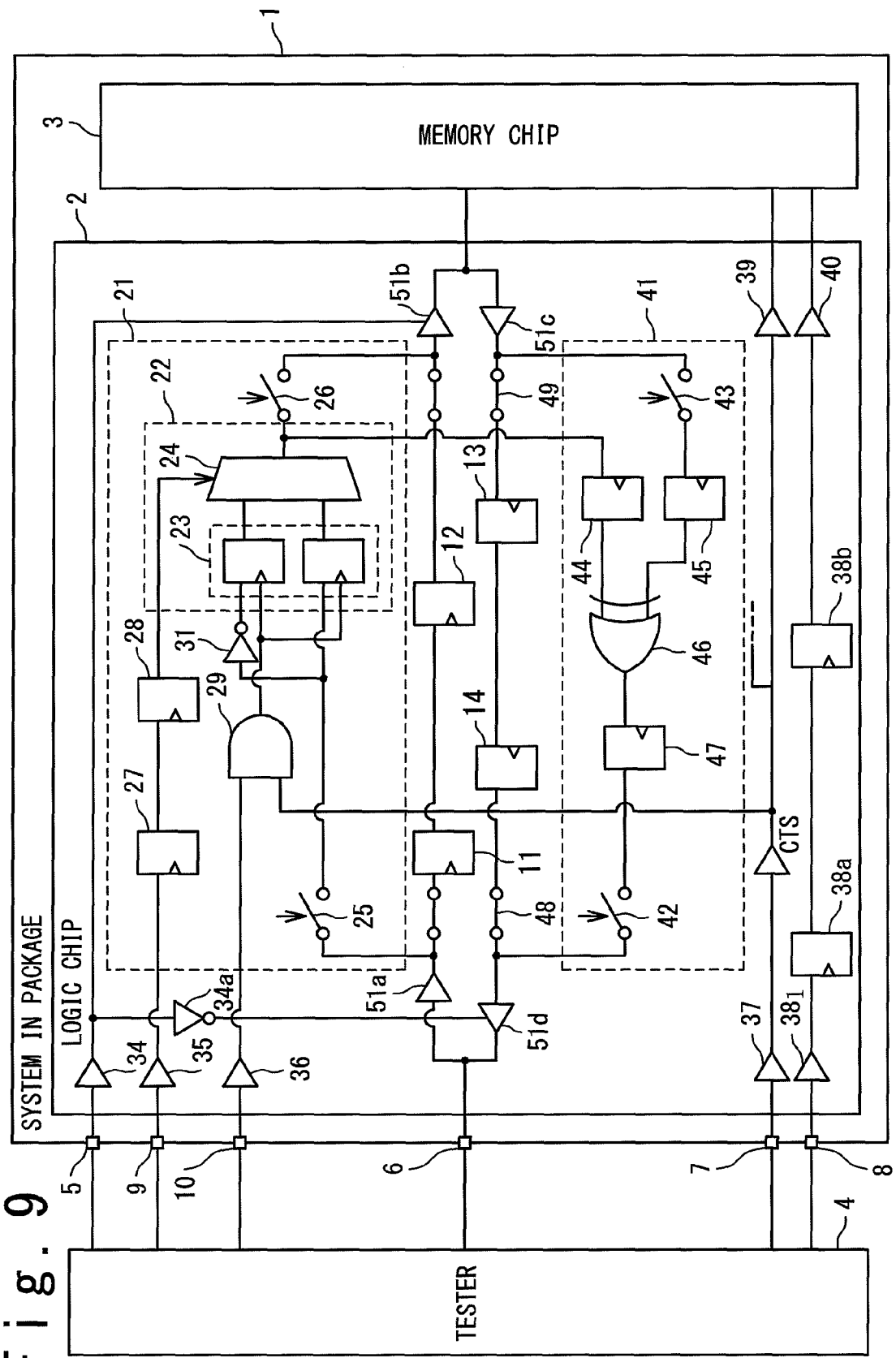
FIG. 9 is a circuit diagram showing the configuration of the system-in-package type semiconductor device according to a second embodiment of the present invention.

The system-in-package type semiconductor device 1 according to a second embodiment of the present invention will be described with reference to the attached drawings. FIG. 9 is a circuit diagram showing the configuration of the system-in-package 1 in the second embodiment. The semiconductor device 1 in the second embodiment includes an activated circuit 41 activated in a serial mode in addition to the configuration of the semiconductor device 1 in the first embodiment. The semiconductor device 1 in the second embodiment uses data held in the register group 23 as the read expectation value, and performs an EXOR calculation based on data read from the register group 23 and data read from the memory chip 3.

Referring to FIG. 9, the data input/output circuit 51 in the semiconductor device 1 in the second embodiment includes a seventh switch 48 and an eighth switch 49. The switch 48 is provided between the output of the flip-flop 14 and the input of the controlled buffer 51d, and the switch 49 is provided between the output of the controlled buffer 51c and the data input terminal of the flip-flop 13.

Also, the activated circuit 41 activated in the serial mode includes a fifth switch 42, a sixth switch 43, a first flip-flop 44, a second flip-flop 45, an EXOR circuit 46 and a third flip-flop 47. A data input terminal of the flip-flop 44 is connected to a node between the output of the buffer 51c and the switch 49 through the switch 43. The outputs of the flip-flops 44 and 45 are connected to the EXOR circuit 46, an output of which is connected to an data input terminal of the flip-flop 47. An output of the flip-flop 47 is connected to a node between the switch 48 and the buffer 51d through 42. The activated circuit 41 activated in the serial mode forms a data output route by closing the fifth switch 42 and the sixth switch 43.

Figure 10:
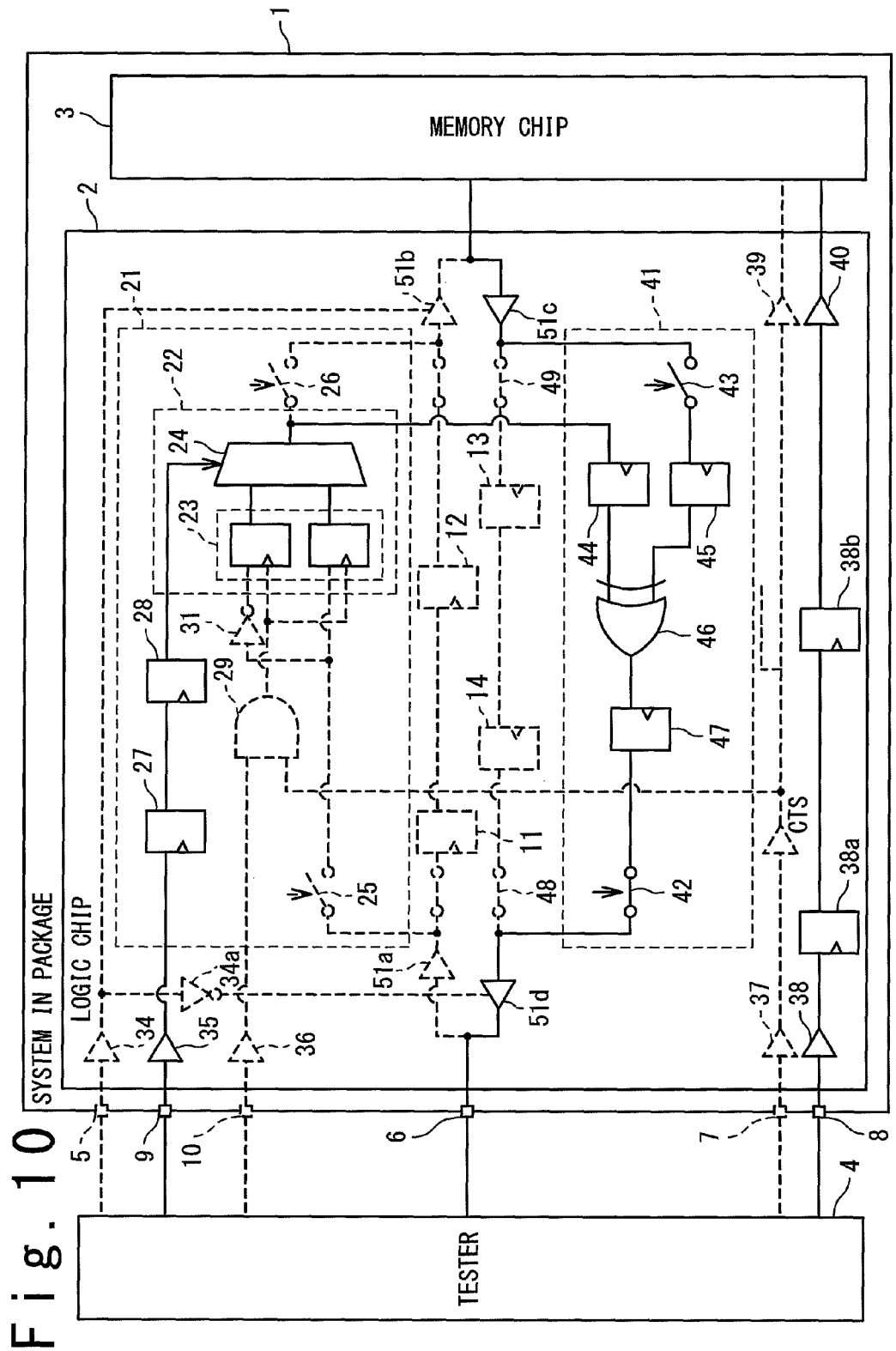
FIG. 10 is a circuit diagram showing a data input/output route in a test operation of the system-in-package type semiconductor device in the second embodiment.

FIG. 10 is a circuit diagram showing a data output route in the second embodiment. As shown in FIG. 10, the logic chip 2 in the second embodiment outputs the test data through the activated circuit 41 in response to the test data read command through the address/control signal supply terminal 8. The system-in-package type semiconductor device 1 supplies the test data read command through the address/control signal supply terminal 8 to the memory chip 3 with a delay of 2 clock pulses. The test data read from the memory chip 3 is supplied to the EXOR circuit 46 through the flip-flop 45 in the serial mode. At this time, the register data held in the register group 23 is also supplied to the EXOR circuit 46. The EXOR circuit 46 performs an exclusive-OR operation based on the data supplied from the flip-flop 44 and the data supplied from the second flip-flop 45. The activated circuit 41 outputs the operation result through the data input/output terminal 6.

Figure 11:
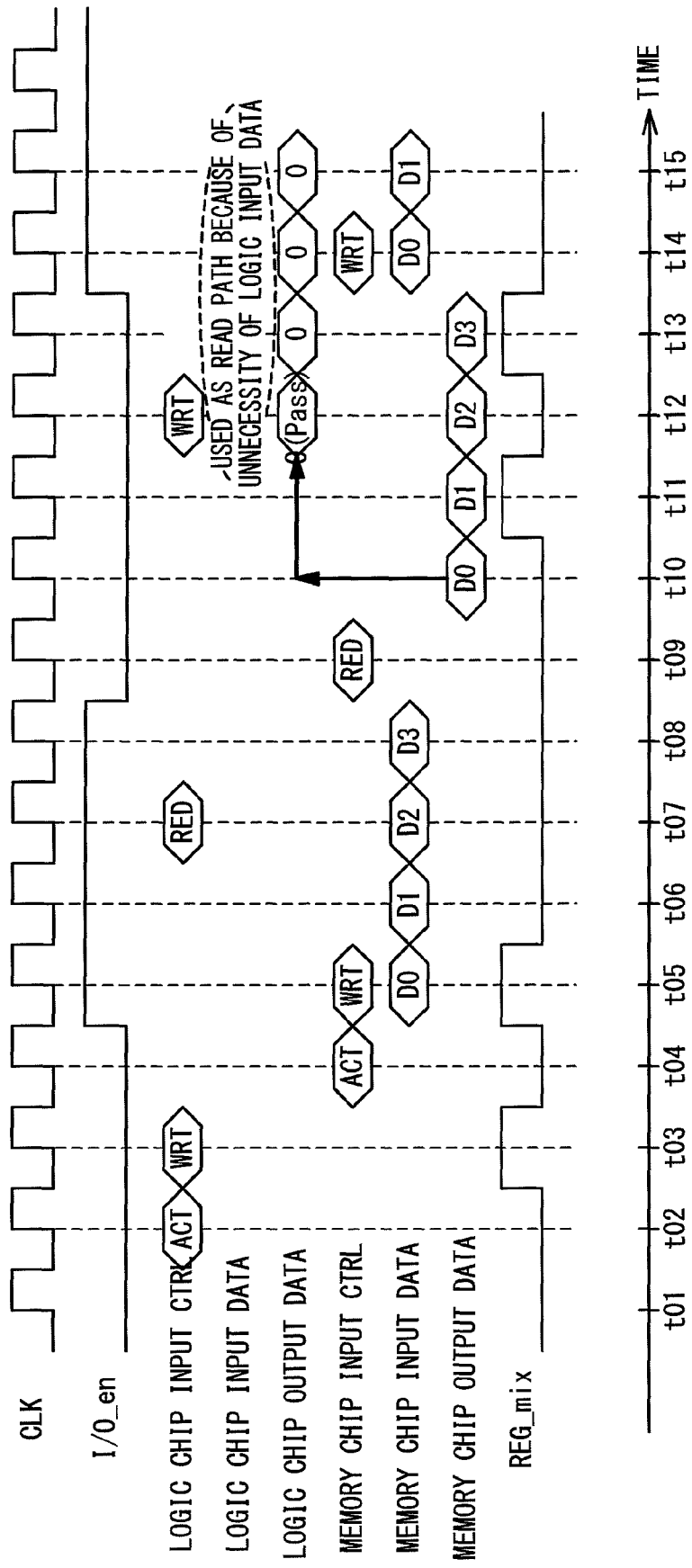
FIG. 11 is a timing chart showing a test data write operation and a test data read operation of the system-in-package type semiconductor device in the second embodiment.

FIG. 11 shows timing charts of an operation in the second embodiment. FIG. 11 illustrates a data write operation and a data read operation. The logic chip 2 receives the test data write command through the address/control signal supply terminal 8 at time t02. Meanwhile, the logic chip 2 receives the test data write command into the memory chip 3 from the tester 4 with a delay of 2 clock pulses (i.e., at time t04). At time t07, the logic chip 2 receives the test data read command supplied through the address/control signal supply terminal 8. The test data read command is supplied to the memory chip 3 with a delay of 2 clock pulses (i.e., at time t09). At this time, the test data of data patterns stored in the register group 23 are used as a read expectation value, which is compared with the data read from the memory chip 3. The semiconductor device 1 in the second embodiment outputs the comparison result through the data input/output terminal 6.

The semiconductor device 1 in the second embodiment outputs through the data input/output terminal 6, the comparison result with the data from the register group 23 with a delay of 2 clock pulses after the data is read from the memory chip 3. As a consequence, a delay of 4 clock pulses in total is caused after reception of the test data read command. Here, when the test data of data patterns are held in the semiconductor device 1 in the second embodiment, an arbitrary data pattern may be selected among the data patterns under a control based on a data pattern selection signal REG_mux.

The semiconductor device 1 in the second embodiment serially stores the data in the register group 23 through the data input/output terminal 6. Then, the semiconductor device 1 uses the stored data as the expectation value, and used for a comparison with the data read from the memory chip 3. The semiconductor device 1 in the second embodiment outputs the comparison result through the data input/output terminal 6. In this manner, it is possible to adequately output a data of PASS/FALL. Moreover, in the second embodiment, an OR circuit (not shown) may be included behind the EXOR circuit 46. In this case, an OR operation is performed in order to detect an error bit, and the operational result is outputted through the data input/output terminal 6.

Figure 12:
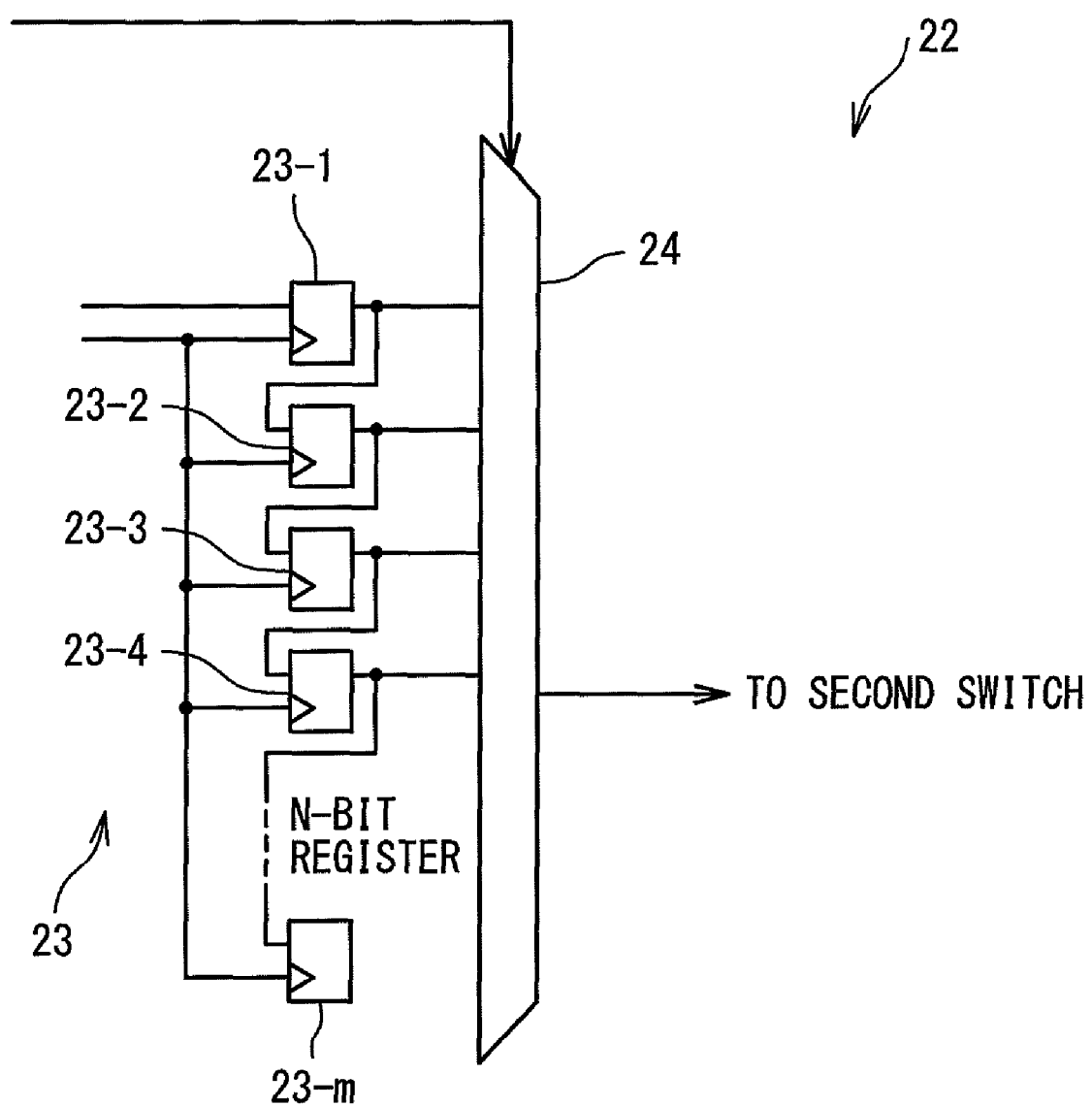
FIG. 12 is a circuit diagram showing a configuration of a test data holding circuit provided in a logic chip.

Additionally, in the above description, the register group 23 includes the first register 23-1 and the second register 23-2. In this case, two test patterns can be handled. The register group 23 in the present invention may be provided with more registers. FIG. 12 is a circuit diagram showing a configuration of a test data holding circuit 22 provided with the first resister 23-1 to an $m^{th}$ resister 23-$m$. When the number of test patterns is m (m is an arbitrary natural number), it is possible to handle the test patterns by providing the registers of a multiple of a bus width by m. In this case, a relationship between the number of data patterns and the number p of selected signal lines is expressed by a following equation:

$$2^P = m.$$

Although the present invention has been described above in connection with several embodiments thereof, it would be apparent to those skilled in the art that those embodiments are provided solely for showing the present invention, and should not be relied upon to construe the appended claims in a limiting sense.

What is claimed is:

1. A system-in-package type semiconductor device comprising: a logic chip; and a memory chip connected with external terminal through said logic chip, wherein said logic chip
comprises a data holding circuit configured to hold a test data in a test mode,
stores the test data supplied through a data input/output terminal in said data holding circuit in response to a test data set command, and
writes the test data which has been stored in said data holding circuit in said memory chip in response to a test data write command,
wherein the data holding circuit is configured to only hold data to be written in said memory chip,
wherein said logic chip reads the test data stored in said memory chip as a read test data in response to a test data read command, and outputs the read test data through said data input/output terminal,
wherein said data holding circuit comprises a plurality of registers, which hold a plurality of the test data corresponding to different test patterns, and
wherein said data holding circuit comprises a selector which selects one of said plurality of registers in response to a register selection instruction externally supplied from said logic chip.

2. The system-in-package type semiconductor device according to claim 1, wherein said logic chip comprises:
a data setting circuit configured to supply the test data to said data holding circuit;
a data write circuit configured to supply the test data stored in said data holding circuit to said memory chip; and
a data read circuit configured to read the test data having stored in said memory chip,
said data setting circuit comprises:
a logical AND circuit configured to output a clock signal in response to the test data set command; and
a first switch configured to connect said data input/output terminal and said data holding circuit.

3. The system-in-package type semiconductor device according to claim 2, wherein said data write circuit comprises:
a second switch configured to connect said data holding circuit and said memory chip.

4. The system-in-package type semiconductor device according to claim 3, wherein said data read circuit comprises:
a data comparing circuit configured to compare the read test data and the test data stored in said data holding circuit,
said data comparing circuit comprises:
an exclusive OR circuit configured to execute an EXOR calculation of the read test data and an expectation data read from said data holding circuit in response to said test data read command, and
the execution result of the EXOR calculation is outputted through said data input/output terminal.

5. The system-in-package type semiconductor device according to claim 1, wherein the data holding circuit is configured to hold data only in the test mode.

6. A logic chip comprising:
a data holding circuit configured to hold a test data in a test mode;
a data setting circuit configured to supply the test data to said data holding circuit;
a data write circuit configured to supply the test data stored in said data holding circuit to a memory chip,
wherein said data setting circuit stores the test data supplied through a data input/output terminal in said data holding circuit in response to a test data set command,
wherein said data write circuit writes said test data stored in said data holding circuit in the memory chip in response to a test data write command,
wherein said data holding circuit is configured to only hold data to be written in the memory chip,
wherein said logic chip reads the test data stored in said memory chip as a read test data in response to a test data read command, and outputs the read test data through said data input/output terminal,
wherein said data holding circuit comprises a plurality of registers, which hold a plurality of the test data corresponding to different test patterns, and
wherein said data holding circuit comprises a selector which selects one of said plurality of registers in response to a register selection instruction externally supplied from said logic chip.

7. The logic chip according to claim 6, further comprising:
a data read circuit configured to read the test data stored in said memory chip,
wherein said data read circuit reads the test data stored in said memory chip as a read test data in response to a test data read command, and compares the read test data and the test data stored in said data holding circuit.

8. The logic chip according to claim 6, wherein said data holding circuit is configured to hold data only in the test mode.

* * * * *